United States Patent
Rueffer et al.

(10) Patent No.: US 9,343,337 B2
(45) Date of Patent: May 17, 2016

(54) DEVICE AND METHOD FOR COATING A SUBSTRATE USING CVD

(75) Inventors: Martin Rueffer, Amberg (DE); Stefan Rosiwal, Bamberg (DE); Christian Bareiss, Aachen (DE); Walter Reichert, Aachen (DE); Oliver Lemmer, Aachen (DE); Marc Perle, Forchheim (DE)

(73) Assignees: DIACCON GMBH, Fuerth (DE); CEMECON AG, Wuerselen (DE)

( * ) Notice: Subject to any disclaimer, the term of this patent is extended or adjusted under 35 U.S.C. 154(b) by 1180 days.

(21) Appl. No.: 13/130,910

(22) PCT Filed: Nov. 13, 2009

(86) PCT No.: PCT/EP2009/065176
§ 371 (c)(1),
(2), (4) Date: Aug. 8, 2011

(87) PCT Pub. No.: WO2010/057836
PCT Pub. Date: May 27, 2010

(65) Prior Publication Data
US 2011/0287194 A1    Nov. 24, 2011

(30) Foreign Application Priority Data
Nov. 24, 2008 (DE) .......................... 10 2008 044 028

(51) Int. Cl.
*H01L 21/67* (2006.01)
*C23C 16/24* (2006.01)
(Continued)

(52) U.S. Cl.
CPC .......... *H01L 21/67115* (2013.01); *C23C 16/24* (2013.01); *C23C 16/27* (2013.01);
(Continued)

(58) Field of Classification Search
CPC .. B23K 35/222; C22C 32/0021; C23C 16/24; C23C 16/27; C23C 16/271; C23C 16/44; C23C 16/273; C23C 16/448; C30B 25/10; C30B 29/04; C30B 29/06; H01L 21/67115; B26F 3/06–3/12; B27M 1/06

USPC .......... 118/715, 723 HC, 724, 725; 248/325, 248/364; 427/249.11, 249.7, 585
See application file for complete search history.

(56) References Cited

U.S. PATENT DOCUMENTS 1,448,480 A * 3/1923 Bedell .............................. 49/147
1,487,436 A * 3/1924 Brooks .................... 137/355.25
(Continued)

FOREIGN PATENT DOCUMENTS

DE    102008044028 A1 *  8/2010
EP    0470447             2/1992
(Continued)

OTHER PUBLICATIONS

Dictionary.com, "breakthrough," in Collins English Dictionary—Complete & Unabridged 10th Edition. Source location: HarperCollins Publishers. http://dictionary.reference.com/browse/breakthrough. Available: http://dictionary.reference.com. Accessed: Oct. 31, 2014.*

(Continued)

*Primary Examiner* — Jeffrie R Lund
*Assistant Examiner* — Stanislav Antolin
(74) *Attorney, Agent, or Firm* — Manabu Kanesaka

(57) ABSTRACT

The invention relates to a device for coating a substrate using CVD, in particular for coating with diamond or silicon, wherein a neat conductor array composed of a plurality of elongated heat conductors (2) is provided in a housing (9), said heat conductors extending between a first (1) and a second electrode (6), wherein the heat conductors are held individually tensioned by a weight (4) attached to one end thereof. To increase the life of the neat conductors (2), the invention proposes that the weight (4) or the heat conductor (2) be guided at the second electrode (6), forming an electrical loop contact, in such a way that a vector of the weight force (G) produced by the weight (4) makes an angle (α) of no more than 45° with a direction of the longitudinal extension of the heat conductor (2).

19 Claims, 4 Drawing Sheets

Figure 5:
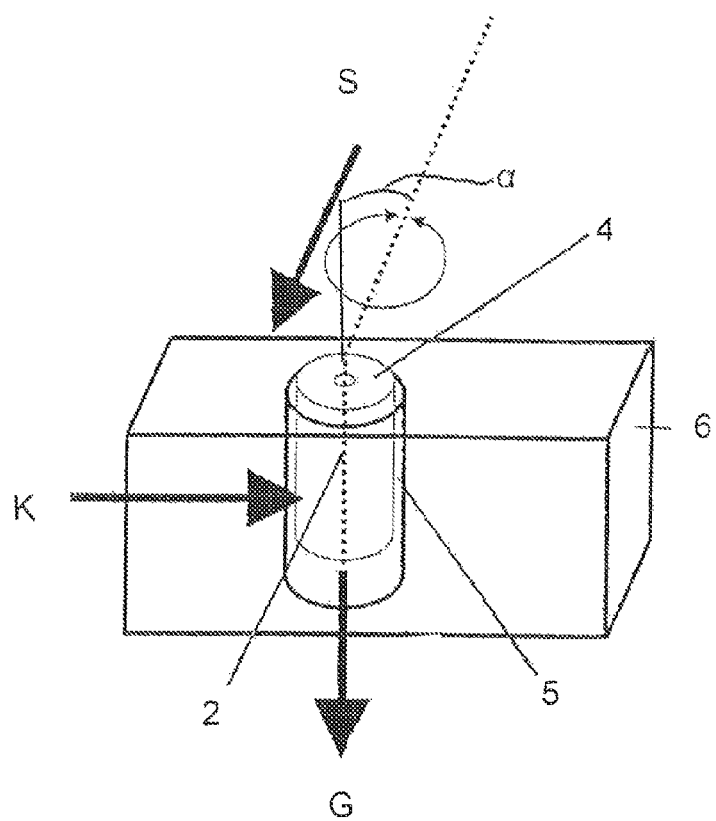

(51) Int. Cl.
*C23C 16/27* (2006.01)
*C23C 16/44* (2006.01)
*C30B 29/04* (2006.01)
*C30B 29/06* (2006.01)

(52) U.S. Cl.
CPC ............ *C23C 16/271* (2013.01); *C23C 16/273* (2013.01); *C23C 16/44* (2013.01); *C30B 29/04* (2013.01); *C30B 29/06* (2013.01)

(56) References Cited

U.S. PATENT DOCUMENTS

| | | | |
|---|---|---|---|
| 2,996,806 A * | 8/1961 | Zieher | 33/783 |
| 3,349,721 A * | 10/1967 | Leon Carlier | 104/196 |
| 4,953,499 A * | 9/1990 | Anthony et al. | 118/724 |
| 4,958,592 A * | 9/1990 | Anthony et al. | 118/724 |
| 4,970,986 A * | 11/1990 | Anthony et al. | 118/724 |
| 5,096,736 A * | 3/1992 | Anthony et al. | 427/590 |
| 5,146,481 A * | 9/1992 | Garg et al. | 378/35 |
| H001249 H * | 11/1993 | Machonkin et al. | 438/21 |
| 5,314,570 A * | 5/1994 | Ikegaya et al. | 117/103 |
| 5,391,229 A * | 2/1995 | Kosky et al. | 118/500 |
| 5,833,753 A * | 11/1998 | Herlinger et al. | 118/724 |
| 6,214,706 B1 * | 4/2001 | Madan et al. | 438/482 |
| 6,432,206 B1 * | 8/2002 | Tolt | 118/724 |
| 6,582,780 B1 * | 6/2003 | Tolt | 427/587 |
| 6,692,574 B1 * | 2/2004 | Tolt | 118/715 |
| 6,709,512 B2 * | 3/2004 | Yamoto et al. | 117/90 |
| 6,981,465 B2 * | 1/2006 | Chae | 118/723 HC |
| 7,000,873 B2 * | 2/2006 | Metelski | 248/123.11 |
| 2001/0047758 A1 * | 12/2001 | Matthee et al. | 118/718 |
| 2003/0010290 A1 * | 1/2003 | Matthee et al. | 118/718 |
| 2004/0065260 A1 * | 4/2004 | Ishibashi et al. | 118/724 |
| 2004/0069231 A1 * | 4/2004 | Chae | 118/723 HC |
| 2008/0035060 A1 * | 2/2008 | Wang et al. | 118/723 HC |
| 2009/0023274 A1 * | 1/2009 | Cao et al. | 438/478 |

FOREIGN PATENT DOCUMENTS

| | | |
|---|---|---|
| EP | 0714997 | 6/1996 |
| JP | S64-072992 | 3/1989 |
| JP | H04-021777 | 1/1992 |
| JP | 2007-230799 | 9/2007 |
| WO | WO02/068709 | 9/2002 |
| WO | WO2008/003275 | 1/2008 |
| WO | WO 2008003275 A1 * | 1/2008 |
| WO | WO 2010057836 A1 * | 5/2010 |

OTHER PUBLICATIONS

IMPulse NC, Inc. "Counterweights," in IMPulse NC, Inc. Catalog. 2005. pp. 2.01-2.07. Source location: IMPulse NC LLC. http://www.impulsenc.com. Available: http://www.impulsenc.com. Accessed: Nov. 1, 2014.*

* cited by examiner

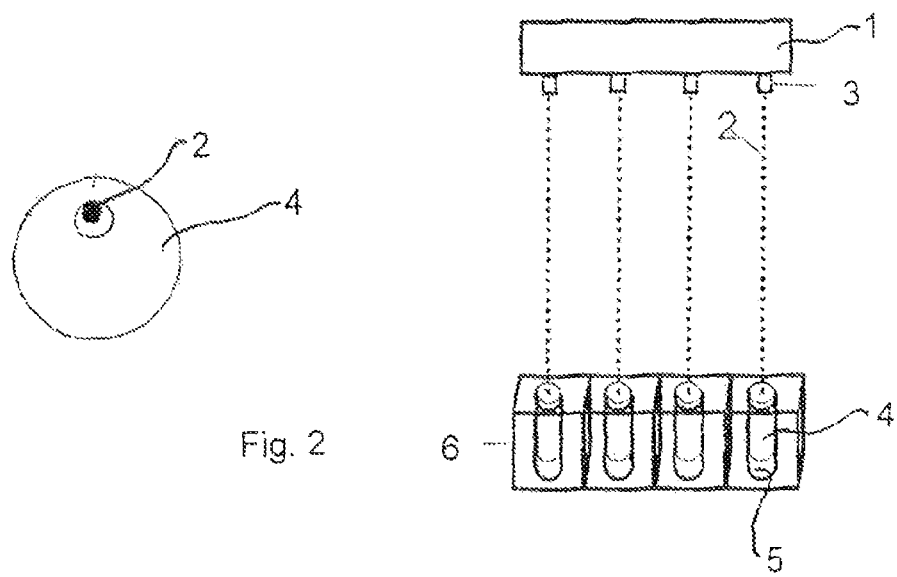
Fig. 2
Fig. 1
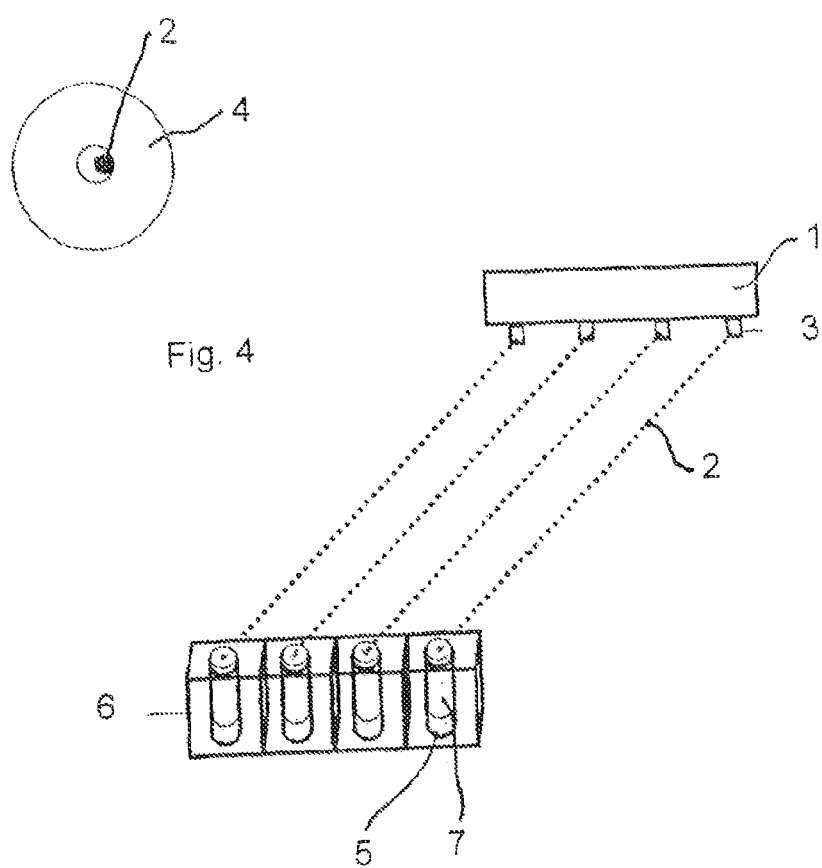
Fig. 4
Fig. 3

DEVICE AND METHOD FOR COATING A SUBSTRATE USING CVD

RELATED APPLICATIONS

The present application is National Phase of International Application No. PCT/EP2009/1065176 filed Nov. 13, 2009 and claims priority from German Application No. 10 2008 044 028.0 filed Nov. 24, 2008 the disclosure of which is hereby incorporated by reference herein in its entirety.

The invention relates to a device for coating a substrate using CVD as well as a method using the device.

Such a device is known from JP 01072992 A. The heating conductors are thereby located horizontally above the substrate to be coated. To generate a suitable tension force, the heating conductors are guided over a redirection unit and provided with a weight on their one end. The device known from prior art has the disadvantage that the heating conductors already break after one or two coating procedures and can then no longer be used. In actual practice, it is necessary to replace the heating conductors after each coating procedure. This requires a great amount of time and expense.

Although it is conceivable to use relatively thick heating conductors having a diameter of approximately 2 mm to eliminate the aforementioned disadvantage, the use of such relatively thick heating conductors also has disadvantages. In contrast to thin heating conductors, thick heating conductors generate a relatively large amount of heat radiation which affects the substrates in an undesirable way, Apart from this, a significantly greater amount of electrical power is required to heat thicker heating wires.

The object of the invention is to eliminate the disadvantages of prior art. In particular, a device is to be specified which permits multiple coating of substrates without having to replace the heating conductors.

According to a further goal of the invention, the amount of electrical power used should thereby be as low as possible. A further object of the invention is the specification of a method which is as efficient as possible for coating a substrate using CVD.

This object is resolved by the features as described below.

According to the provisions of the invention, it is provided that the weight or the heating conductor is guided, at the second, electrode, forming an electrical sliding contact, so that a vector of the weight force generated by the weight, forms an angle of not more than 45° with a direction of the longitudinal extension of the heating conductor.—Even when thin heating conductors are used this surprisingly drastically increases their life. Since an electrical sliding contact is provided between the heating conductor and the second electrode, thermally-induced changes in length of the heating conductor can be compensated during heating up and cooling off. The weight force generated by the weight acts according to the invention essentially in the direction of the longitudinal extension of the heating conductor. In other words, the tension force caused by the weight is not exerted on the heating conductor via a sharp bend. It has been shown that particularly also the alignment of the weight force approximately along the direction of the longitudinal extension of the heating conductor makes a significant contribution to its improved service life.—The device provided by the invention ensures that the heating conductors are always held taut and precise, and in particular exactly parallel to each other. Even after a plurality of operating cycles, the heating conductors do not sag. Their distance to the substrate that is to be coated can always be kept reproducibly constant over a plurality of coating procedures.

According to an advantageous embodiment, a contact force forcing the heating conductor or the weight against the second electrode is caused by the weight. That can be achieved in a particularly simple way by adjusting the direction of the longitudinal extension of the heating conductors with the second electrode slightly against the vertical direction. In this case, a vector of the tension, force acting on the heating conductors clamped between the two electrodes is oblique with respect to the vector of the weight force. The tension force represents the resultant from weight force and contact force here.

According to an advantageous embodiment, the weight or the heating conductor abut in a slidably displaceable manner on an interior wall of a recess provided on the second electrode. The recess can be, for example, a slit-like recess in which the heating conductor is guided. Advantageously, the recess has an essentially round cross section. It can be designed as a through hole on the second electrode. In this case, the heating conductor can be guided through the through hole.

According to a further embodiment, it can be that the weight is formed cylindrically. In this case, it is advantageous that the exterior diameter of the weight is less than an interior diameter of the recess. Then, the weight can also be guided in the recess, for example.

In accordance with the subject-matter of this invention, it is considered, as advantageous to keep a bend of the heating conductor as slight as possible in the area of the second, electrode. The vector of the weight force advantageously forms an angle of 5 to 35°, preferably from 10 to 20°, with the direction of the longitudinal extension of the heating conductor.

According to a further advantageous embodiment, it is provided that two adjacent heating conductors are formed from a single wire which bends in the area of the first electrode and is provided with a weight each on both of its ends in the area of the second electrode. For example, the wire can be guided through two further adjacent through holes on the first electrode. The two ends of the wire can then be guided through the through holes provided, for example, on the second electrode and be provided with a weight each on the ends extending out over the second electrode. Naturally a slit-type recess can also be provided instead of the aforementioned through holes.

According to a further embodiment, the heating conductors are made of a refractory metal, preferably from W, Ta, Mo, Rh or an alloy thereof. The suggested materials are suitable, on the one hand, for making particularly thin wires and, on the other hand, can be exposed to high thermal stress.

The heating conductors are advantageously wires with a diameter ranging from 5 µm to 500 µm, preferably ranging from 100 urn to 300 µm. Particularly when heating conductors with a small diameter are used, the required electrical power for coating a substrate can be significantly reduced. At the same time, a high temperature of the heating conductor can be achieved, which supports the generation of atomic hydrogen.

The heating conductors do not absolutely have to be designed in the form of wires. It can also be that they are designed in the form of bands, rods or sheets. A diameter or a cross section area of the heating conductors does not have to be the same over their entire longitudinal extension.

According to a further embodiment, a holder unit is provided on the first electrode to mount the other end of the heating conductor. This can advantageously be a unit for mounting the heating conductor by clamping. The holder unit can in particular be designed so that a mounting of the heating conductors is possible without essentially bending same.

In the device provided by the invention, the first electrode is advantageously located above the second electrode. The heating conductors extend essentially vertically between the first and the second electrodes. They can be slightly oblique with reference to the vertical direction. An angle of obliqueness with reference to the vertical direction is usually ≤20°.

According to a further embodiment of the invention, the first and/or second electrode is made of a dispersion-strengthened copper material. The suggested dispersion-strengthened copper material also maintains an extremely stable shape even at high temperatures. Apart from this, work pieces, in particular profiles or hollow profiles, can be extruded simply and inexpensively from such a material and then processed.

A cooling unit for cooling the first and/or second electrode is advantageously provided. For this purpose, the first and/or second electrode can, for example, be in the shape of a hollow profile through which a cooling fluid flows. The cooling fluid is advantageously water.

According to a further advantageous embodiment, the heating conductor array is designed as a module. In other words, the first and the second electrode are connected permanently relative to each other, with supports which are mounted on the sides, for example, and form a structural unit. Such a structural unit is advantageously designed so that it can be located in a conventional housing of a CVD coating device.

According to further provisions of the invention, a method for coating a substrate using CVD, in particular for coating with diamond or silicon, is provided wherein the following steps are performed using the device provided by the invention:

Evacuation of the housing;

Generation of a reactive gaseous atmosphere containing hydrogen and a gaseous carbon carrier in the housing;

Heating up the heating conductors from, the ambient temperature to a temperature ranging from 1500° C. to 2800° C. for a holding time of 1 to 100 hours;

Evacuation of the housing;

Cooling off the heating conductors to the ambient temperature.

During the evacuation of the housing, a pressure ranging from approximately 0.1 to 400 mbar is set inside. The pressure when generating the reactive gaseous atmosphere is 1 to 400 mbar, preferably 3 to 20 mbar. The reactive gaseous atmosphere advantageously contains 90 to 99.5 wt. % of hydrogen. To make a diamond layer, methane in a concentration of 0.5 to 10 wt. % can be used, for example, as the carbon carrier. To make a silicon layer, the reactive gaseous atmosphere can contain a gaseous silicon carrier instead of the gaseous carbon carrier. The reactive gaseous atmosphere can also optionally contain nitrogen, oxygen, phosphorus or gases containing boron, The heating conductors are advantageously heated to a temperature ranging from 1800° C. to 2500° C., preferably 1900° C. to 2300° C. Particularly at the high, temperatures specified, a graphite precipitation onto the heating conductors from the gaseous phase is avoided. This ensures that the generation of atomic hydrogen on the heating conductors is always maintained in particular even with high concentrations of the carbon carrier in the gaseous phase.—The cooling of the heating conductors to the ambient temperature takes place advantageously in a vacuum, in other words, not in the reactive gaseous atmosphere. The housing is aired after the heating conductors have cooled to the ambient temperature. The coated substrates are then removed.

Due to the further embodiment features of the method, reference is made to the features already described for the device which features can be applied analogously to the method.

Using the method provided by the invention, it is possible to perform up to 50 coating procedures in succession, without having to change the heating conductors. Advantageously, the heating conductors thereby always remain taut.

Figure 6:
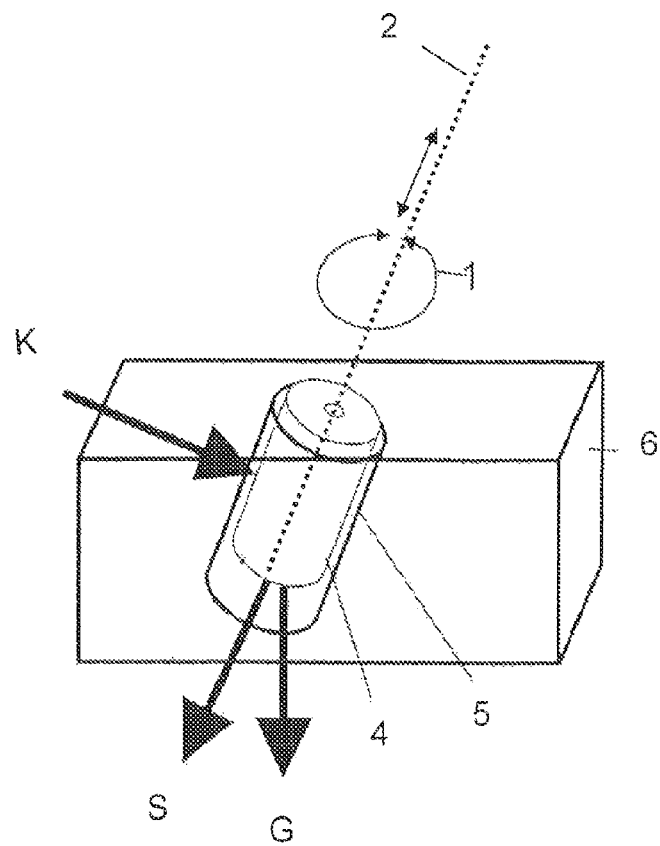
Figure 7:
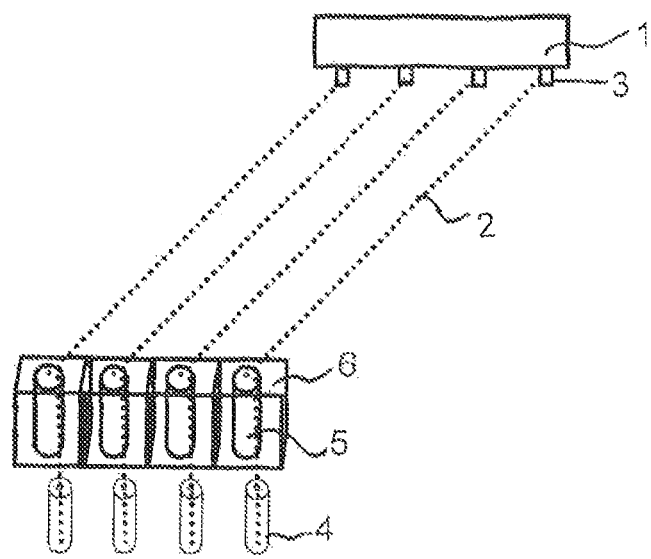
Figure 8:
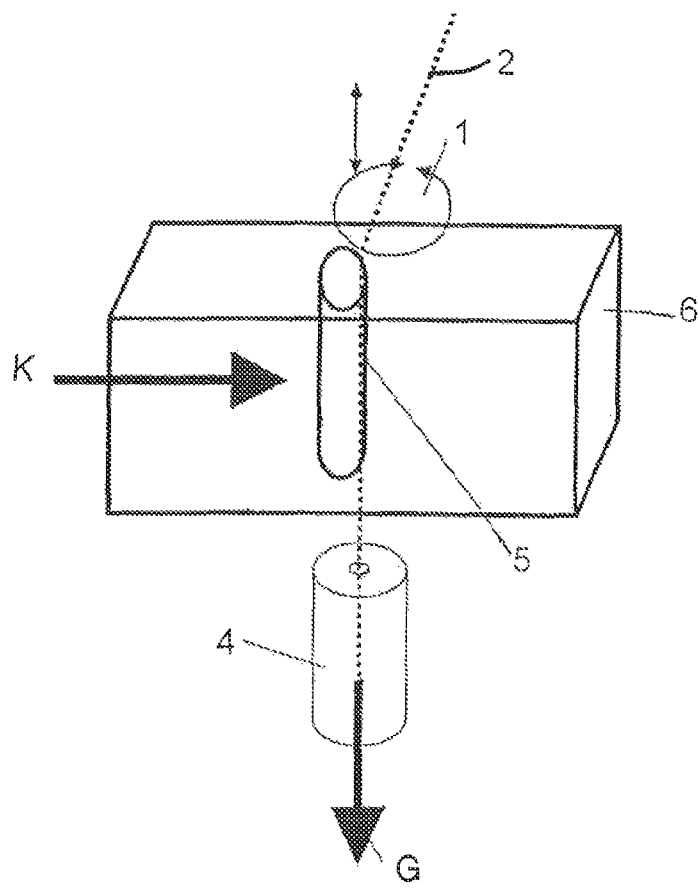
Figure 9:
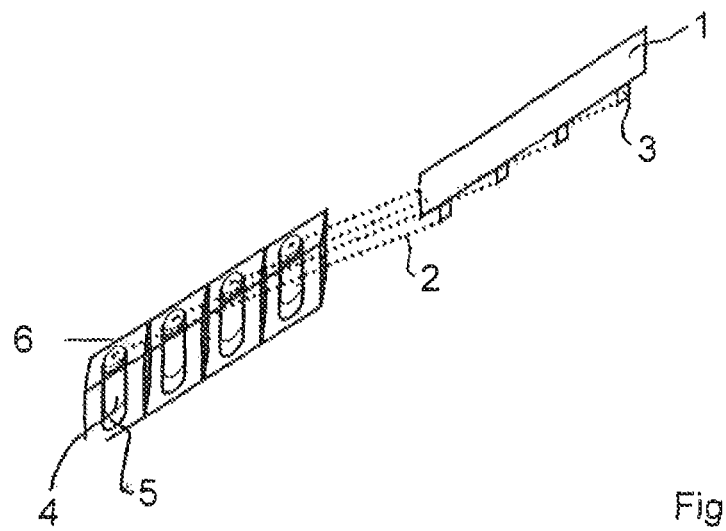
Figure 10:
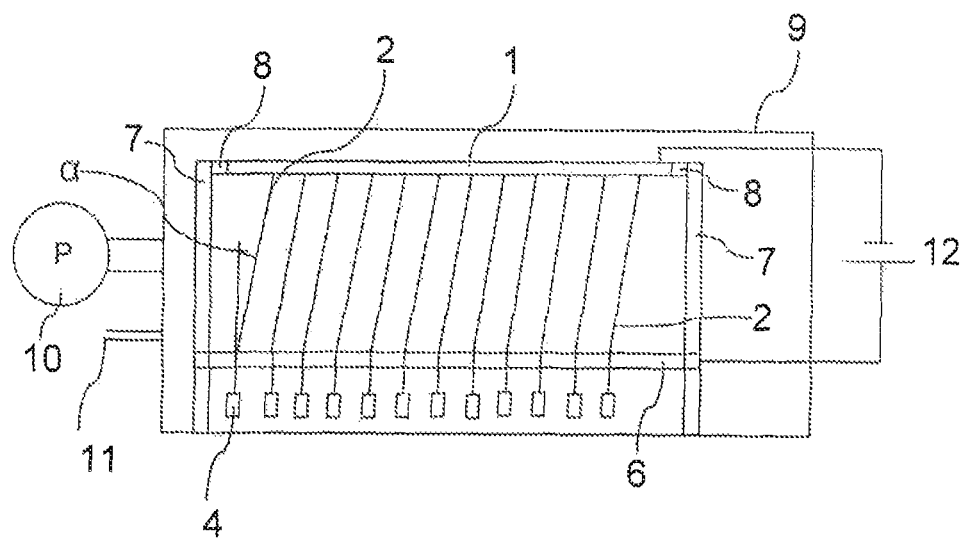

Examples will now be used to describe the invention in more detail based on the drawings. The following figures are listed:

FIG. 1 a schematic view of a first device,
FIG. 2 a top view of the weight as per FIG. 1,
FIG. 3 a schematic view of a second device,
FIG. 4 a top view of the further weight as per FIG. 3,
FIG. 5 a detail view as per FIG. 3,
FIG. 6 a schematic detail view of a third device,
FIG. 7 a schematic view of a fourth device,
FIG. 8 a schematic detail view of the fourth device,
FIG. 9 a schematic view of a fifth device and
FIG. 10 a schematic sectional view of a CVD coating device.

FIG. 1 shows a schematic view of a first device. On a first electrode 1 are mounted a plurality of heating conductors 2 in a row in succession, preferably at approximately the same distance to each other. The heating conductors 2 can be held by clamping in holder units 3 which are provided on the first electrode 1. The heating conductors 2 are held taut individually by weights 4 provided on their ends. The cylindrically designed, weights 4 are guided in a slidably displaceable manner in thereto corresponding recesses 5 which are provided on a second electrode 6. Here, the second electrode 6 is located under the first electrode 1 at a vertical plane running through the first electrode 1. The recesses 5 have a straight contact line or surface with reference to the weights 4 in the axial direction. The holder units 3 on the first electrode 1 and the recesses 5 on the second electrode 6 are designed in such a manner that the heating conductors 2 are held taut in an essentially parallel arrangement.

FIG. 2 shows a top view of the weights 4 as per FIG. 1. As can be seen in FIG. 2, the heating conductors 2 are mounted outside a center of gravity of the weights 4. This causes a tilting moment which forces the weights 4 against an inside surface of the recesses 5. The tilting moment is thereby calculated in such a manner that an electrical sliding contact is created between the second electrode 6 and the weights 4 or the heating conductors 2 mounted thereon. With a thermally induced change of the length of the heating conductors 2, the respective weights 4 slide in a straight line along the inside surface of the respective recess 5.

FIG. 3 and 4 show a schematic view of a second device. The first 1 and the second electrode 6 are located in the same vertical plane. However, the recesses 5 provided on the second electrode 6 are located slightly horizontally staggered in relation to the holder units 3 on the first electrode 1. In this case, the heating conductors 2—as shown in FIG. 4—can be mounted centricly on the cylindrically shaped weights 4. Due to the staggered arrangement of the first 1 and the second electrode 6, a tilting moment is exerted in turn on the weights 4 which causes a contact force K forcing the weights 4 together with an inside wall of the recesses 5. Also here, the contact force K is selected in such a manner that, a vertical movement of the weights 4 within the recess 5 due to thermally caused changes in length of the heating conductors 2 is possible at all times and the heating conductors 2 are always kept taut. Also here, the weights 4 are moved on the inside wall of the recesses 5 along a straight contact, line or surface in case of a thermally caused change in length of the heating conductors 2. Such a straight-lined formation of the contact surface between the weight 4 and the second electrode 6 contributes to particularly low friction losses. The heating conductors 2 can thus be kept taut, at all times.

FIG. 5 shows a detail view as per FIG. 3. It can be seen that a vector of a tension force S acting on the heating conductor 2 runs parallel to the direction of the longitudinal extension of the heating conductor 2. In contrast, a vector of a weight force G generated, by the weight 4 always runs vertically. An angle between the longitudinal extension of the heating conductor 2 and the vector of the weight force G is called α. In the sense of this invention, the term "longitudinal extension" means a direction which the heating conductor 2 delineates from the first 1 to the second electrode 6.

K is a vector of a contact force running perpendicular to the vector of the weight force G with which contact force the weight 4 is forced, against the inside wall of the recess 5. The contact force K depends on the angle α as well as the weight force G. The angle α is advantageously selected from a range from 10 to 20°. With this embodiment, a movement of the weight 4 being in the sliding contact occurs in a straight line and parallel to the vector of the weight force G.

FIG. 6 shows a detail view of a third device. An axis of the recess 5 formed once again cylindrically runs parallel to the direction of the longitudinal extension of the heating conductor 2. In this case, the vector of the contact force K is perpendicular to the vector of the tension force S. Also here, the weight 4 is forced against the inside wall, of the recess 5 so that, on the one hand, the heating conductor 2 is kept taut with the weight 4 and, on the other hand, an electrical sliding contact is established. The weight 4 thereby moves in a straight line along the contact surface.

FIGS. 7 and 8 show a fourth device. The recesses 5 on the second electrode 6 are thereby designed in the form of through holes. The holder units 3 on the first electrode 1 are in turn arranged staggered to the corresponding recesses 5 so that the heating conductors 2 between the first electrode 1 and the second electrode 6 are not held taut vertically but in an oblique direction which slightly deviates from the vertical direction. The heating conductors 2 are guided through the through holes 5 provided on the second electrode 6. The weights 4 are each mounted under the second electrode 6 on the free ends of the heating conductors 2. A contact line or surface between the heating conductor 2 and the recess 5 is also designed in a straight line here. This increases the life of the heating conductors 2. At the same time a frictional resistance is decreased during equalization of thermally induced changes in length of the heating conductors 2.

As can be seen in FIG. 8, with this arrangement a contact force K acting on the heating conductor 2 perpendicularly to the weight force G results, which contact force K forces the heating conductor 2 against the inside wall of the through holes 5. Here, the electrical sliding contact is therefore created immediately between the heating conductor 2 and the second electrode 6.

FIG. 9 shows a schematic representation of a fifth device. Although the first electrode 1 is thereby above the second electrode 6, it is not located in the same vertical plane as the second electrode 6. In other words, the holder units 3 provided on the first electrode 1 are staggered in relation to the corresponding recesses 5 on the second electrode 6 in such a manner that the heating conductors 2 are arranged not in a vertical plane but oblique in the space instead. An angle of obliqueness of the heating conductors 2 in reference to the vertical direction is thereby advantageously less than 45°, preferably less than 30°. Also in this case,—similarly to the example of the embodiment shown in FIG. 5—a contact force K results which forces the weights 4 against the inside surface of the recesses 5. An increasing or decreasing coating thickness can be realized on the substrates using the suggested arrangement of the heating conductors 2 on an oblique plane having a horizontal arrangement of the substrates to be coated in relation thereto.

FIG. 10 shows a schematic view of a CVD coating device. The first 1 and the second electrode 6 are thereby connected with each other via supports 7 and having an interconnection of electrical insulation means 8. Together with the heating conductors 2 mounted thereon, they create a heating conductor array here which is installed in a gas-proof housing 9. A pump 10 is provided to evacuate the housing 9. Reference sign 11 is a pipe through which reaction gas can be led into the housing 9 if desired. The first 1 and the second electrode 6 are connected with a power source 12 to heat the heating conductors 2.

REFERENCE SIGNS

1 First electrode
2 Heating conductor
3 Holder unit
4 Weight
5 Recess
6 Second electrode
7 Support
8 Electrical insulation means
9 Housing
10 Pump
11 Pipe
12 Power source
α Angle
G Weight force
K Contact force
S Tension force

The invention claimed is:

1. A device for coating a substrate with diamond or silicon by CVD, comprising:
   a housing comprising a heating conductor array therein,
   wherein the heating conductor array comprises a first electrode, a second electrode, and a plurality of heating conductors extending in a longitudinal extension direction from the first electrode to the second electrode,
   the heating conductors are individually held taut by a weight mounted on one end of the heating conductors, and
   the heating conductors are disposed obliquely with reference to a vertical direction thereof such that the weight or the heating conductor is guided at the second electrode forming an electrical sliding contact in such a manner that a vector of weight force (G) created by the weight forms an angle (α) of 5° to not more than 45° with a longitudinal extension direction of the heating conductor.

2. The device as defined in claim 1, wherein a contact force (K) forcing the heating conductor or the weight against the second electrode is caused by the weight.

3. The device as defined in claim 1, wherein the weight or the heating conductor abuts in a slidably displaceable manner on an interior wall of a recess provided on the second electrode.

4. The device as defined in claim 3, wherein the recess has a round cross section.

5. The device as defined in claim 3, wherein the recess is a through hole provided in the second electrode.

6. The device as defined in claim 5, wherein the heating conductor is guided through the through hole.

7. The device as defined in claim 1, wherein the weight is in a cylindrical shape.

8. The device as defined in claim 3, wherein an outer diameter of the weight is less than an inner diameter of the recess.

9. The device as defined in claim 1, wherein the vector of the weight force (G) forms the angle (α) in a range of 5° to 35 with the longitudinal extension direction of the heating conductor.

10. The device as defined in claim 1, wherein two adjacent heating conductors are made of a single wire which bends around in an area of the first electrode and are provided on the one end of each of the heating conductors with the weight in an area of the second electrode.

11. The device as defined in claim 1, wherein the heating conductors are made of a refractory metal.

12. The device as defined in claim 1, wherein a diameter of the heating conductors is in a range of 5 to 500 µm.

13. The device as defined in claim 1, wherein the first electrode is located above the second electrode and the heating conductors extend vertically between the first electrode and the second electrode.

14. The device as defined in claim 1, wherein the first electrode and/or the second electrode is made of a dispersion-strengthened copper material.

15. The device as defined in claim 1, further comprising a cooling unit for cooling the first electrode and/or the second electrode.

16. The device as defined in claim 1, wherein the heating conductor array is designed as a module.

17. The device as defined in claim 9, wherein the vector of the weight force (G) forms the angle (α) in the range of 10° to 20° with the longitudinal extension direction of the heating conductor.

18. The device as defined in claim 11, wherein the heating conductors are made of W, Ta, Mo, Rh or an alloy thereof.

19. The device as defined in claim 12, wherein the diameter of the heating conductors is in the range of 100 to 300 µM.

* * * * *